United States Patent
Bostica et al.

[19]

[11] Patent Number: 5,828,246
[45] Date of Patent: Oct. 27, 1998

[54] CIRCUIT IN CMOS TECHNOLOGY FOR HIGH SPEED DRIVING OF OPTICAL SOURCES

[75] Inventors: Bruno Bostica, Pino Torinese; Marco Burzio, Grugliasco; Paolo Pellegrino, Turin; Luca Pesando, Bussoleno, all of Italy

[73] Assignee: Cselt Studi E Laboratori Telecomuni-Cazioni S.P.A., Turin, Italy

[21] Appl. No.: 815,118

[22] Filed: Mar. 11, 1997

[30] Foreign Application Priority Data

Apr. 24, 1996 [IT] Italy ................................ TO96A0326

[51] Int. Cl.⁶ ............................................. H03K 3/42
[52] U.S. Cl. ............................................. 327/108; 327/514
[58] Field of Search ................................ 327/108, 109, 327/514, 403, 404; 372/26, 28, 29, 32; 359/180, 181; 326/82, 83, 87, 91

[56] References Cited

U.S. PATENT DOCUMENTS 5,589,786  12/1996  Bella et al. ............................ 327/108
5,675,599  10/1997  Abe et al. .............................. 372/38

*Primary Examiner*—Timothy P. Callahan
*Assistant Examiner*—T. T. Lam
*Attorney, Agent, or Firm*—Herbert Dubno

[57] ABSTRACT

A circuit source has bias and modulation current generators for both p-type and n-type optical sources, and a pair of sources of control voltages for the bias and modulation current generators, which obtain pairs of control voltages from an adjustable driving current. An external signal allows selecting, by means of a control logic and CMOS gates, the generators required by the source. The circuit is made by using three pads of an integrated circuit, one for each control voltage source and the third comprising the current generators, the CMOS gates and the control logic.

5 Claims, 3 Drawing Sheets

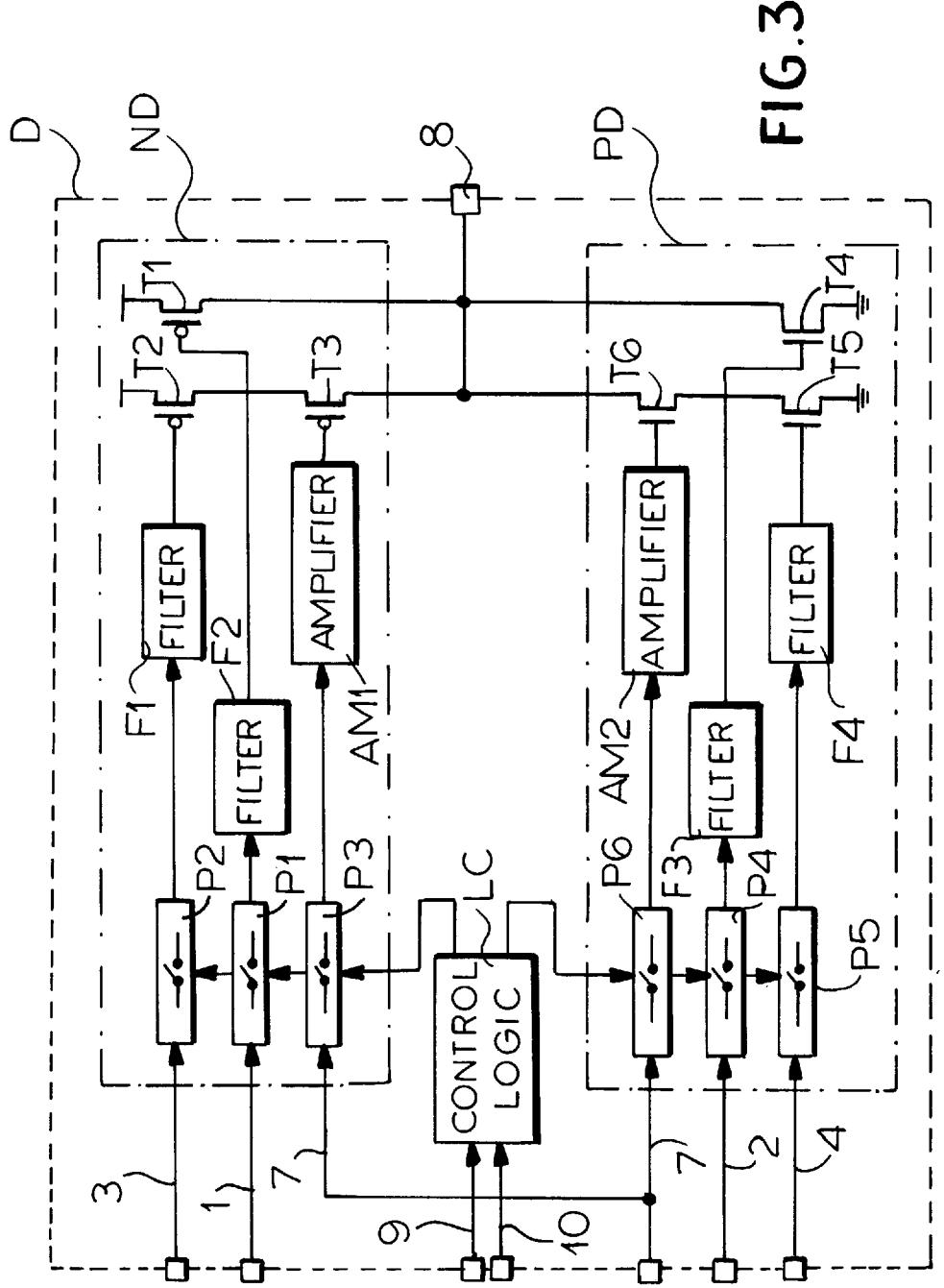

CIRCUIT IN CMOS TECHNOLOGY FOR HIGH SPEED DRIVING OF OPTICAL SOURCES

FIELD OF THE INVENTION

The invention described herein relates to optical communication systems and more particularly, to a circuit in CMOS technology for high speed driving of optical sources.

BACKGROUND OF THE INVENTION

In optical communication systems there is the problem of driving optical sources (such as laser diodes or LEDs) in such a way that they emit appropriate optical signals, to be sent on an optical fiber, in correspondence with the electrical signals emitted by an electrical data source. Referring for simplicity to laser diodes, it is known that a laser diode emits an optical radiation only when the current flowing in it exceeds a threshold current $I_s$ and that the power of the optical radiation emitted is directly proportional to the difference between the current flowing in the laser diode and the threshold current. In digital systems it is common practice to supply the laser diode with such a bias current $I_b$ as to keep it always above the threshold, in order to avoid problems related to an on-off modulation. This bias current is added to a modulation current $I_m$, whose value depends on the logic level of the signal to be transmitted and is proportional to the desired power difference between the two levels. A driving circuit has essentially the aim to supply the laser diode with currents $I_b$ and $I_m$.

The driving circuits are generally manufactured as integrated circuits and can also include other circuits of the transmitter of an optical communication system and possibly the system receiver. For applications not at an excessively high bit-rate (e.g. of the order of the Gbit/s), there is a wide interest in manufacturing those integrated circuits in CMOS technology. CMOS is in fact a well established technology that ensures a high integration density at low cost as well as low power consumption, and that furthermore allows the integration of the driving circuit with other logic circuits which are generally made in CMOS technology, for signal processing.

An example of circuit in CMOS technology for driving optical sources is described by M. Steyaert et al. in the document entitled "150 Mbit/s CMOS LED-driver and PIN-receiver IC for Optical Communication", presented at the IEEE 1992 Custom Integrated Circuits Conference. This circuit, integrated in a single chip with the receiver, is intended to drive an LED at the frequency of 150 Mbit/s. The circuit has at its input side a cascade of CMOS inverters whose function is to couple the CMOS or TTL circuits upstream with the LED driving stage. This driving stage consists essentially of a current mirror circuit, which makes a bias current flow through the LED, the value of the current being imposed by an external resistor, and of a transistor that controls the modulation current and that is arranged in parallel to the current mirror. This circuit works poorly at the relatively high frequencies (>200 MHz) normally demanded by optical fibre communication systems, since in these conditions there is an accentuation in the phenomenon of the production of disturbances that originate on the switching fronts and propagate from the gate input of the transistor controlling the modulation current toward the branch of the current mirror circuit that sets the bias current. This brings about a reduction in the signal-to-noise ratio at the laser diode output, since the current peaks caused by the aforesaid disturbances reduce the dynamic range of the optical signal. Moreover, it is impossible to adjust the modulation current, while the nominal bias current remains rigidly fixed by means of the external resistor.

European Patent Application EP-A 0 687 046 in the name of the same Applicant describes a driving circuit more suited to the high bit rate requirements imposed by optical fiber communication systems. The circuit comprises: a bias current generator, a modulation current generator and a cascade of CMOS inverter stages which supplies a driving voltage to the modulation current generator and receives the data signals at its input. The bias current generator is a MOS transistor, whose gate is connected to a terminal for controlling the bias current, whose source is connected to one of the power supply terminals, and whose drain is connected to one of the terminals of the optical source to be driven. The modulation current generator consists of a pair of MOS transistors, arranged in series, one of which has its drain connected to the terminal of the optical source, its gate connected to the output of the cascade of inverter stages and its source connected to the drain of the second transistor of the pair; in the second transistor, the source is connected to said power supply terminal and the gate is connected to a terminal for modulation control. The terminals for bias and modulation control are connected to respective voltage sources through regulation potentiometers.

The circuit described in the above European Patent Application has still some drawbacks. It can drive laser diodes of a single type (p-type or n-type), and therefore it has a low flexibility. The voltage control of bias and modulation currents of the laser diode makes the circuit sensitive to the manufacturing process of the integrated circuit, since in these conditions the switching point of the transistors depends on the doping, and it is obviously impossible to guarantee that the doping of the n-type and p-type transistors in the inverters is exactly the same. This limits the circuit precision.

SUMMARY OF THE INVENTION

According to the invention, a device is provided allowing driving sources with both conductivity type types and having an operation substantially independent from the fabrication process.

This device comprises:
means for generating a bias current for the optical source, comprising a first MOS transistor whose gate is connected to a first control voltage source, whose source is connected to a first power supply terminal and whose drain is connected to the circuit output; and
means for generating a modulation current for the optical source, comprising a second and a third MOS transistors, arranged in series and having the same conductivity as the first one, the second transistor having its source connected to said first power supply terminal, its gate connected to a second control voltage source and its drain connected to the source of the third transistor, whose gate in turn is connected to an input for a digital data signal and whose drain is connected to the circuit output.

According to the invention, the means for generating the bias current also comprise a fourth MOS transistor, whose conductivity is complementary to that of the first transistor, and in which the gate is connected to the first control voltage source, the source is connected to a second power supply terminal and the drain is connected to the circuit output. The means for generating the modulation current also comprise a fifth and a sixth MOS transistors arranged in series, which have the same conductivity as the fourth transistor, and where the fifth transistor has its source connected to the second power supply terminal, the gate connected to the second control voltage source and the drain connected to the source of the sixth transistor, which in turn has its gate connected to the data signal input and its drain connected to the circuit output. The first and second control voltage sources each have an input connected to a respective generator of an adjustable control current and present each two outputs on which they emit respectively two different control voltages for the control of the bias or the modulation current of sources doped in complementary way, whereby one of the control voltages is supplied to the first and the fourth transistor respectively and the other is supplied to the second and the fifth transistor respectively. The circuit can further compromise.

- a first and a second set of CMOS gates, arranged between the gates of said first, second, and third transistors or respectively of said fourth, fifth, and sixth transistors on one side, and the first and the second control voltage source and the data input on the other; and
- means for enabling, in a mutually exclusive way, either set of gates according to an external selection signal having a first or a second value, according to the conductivity type of the source to be driven.

BRIEF DESCRIPTION OF THE DRAWING

The characteristics of the present invention will become more evident with reference to the enclosed drawing, wherein:

FIG. 3 is a diagram of an output cell; and

SPECIFIC DESCRIPTION

Figure 1:
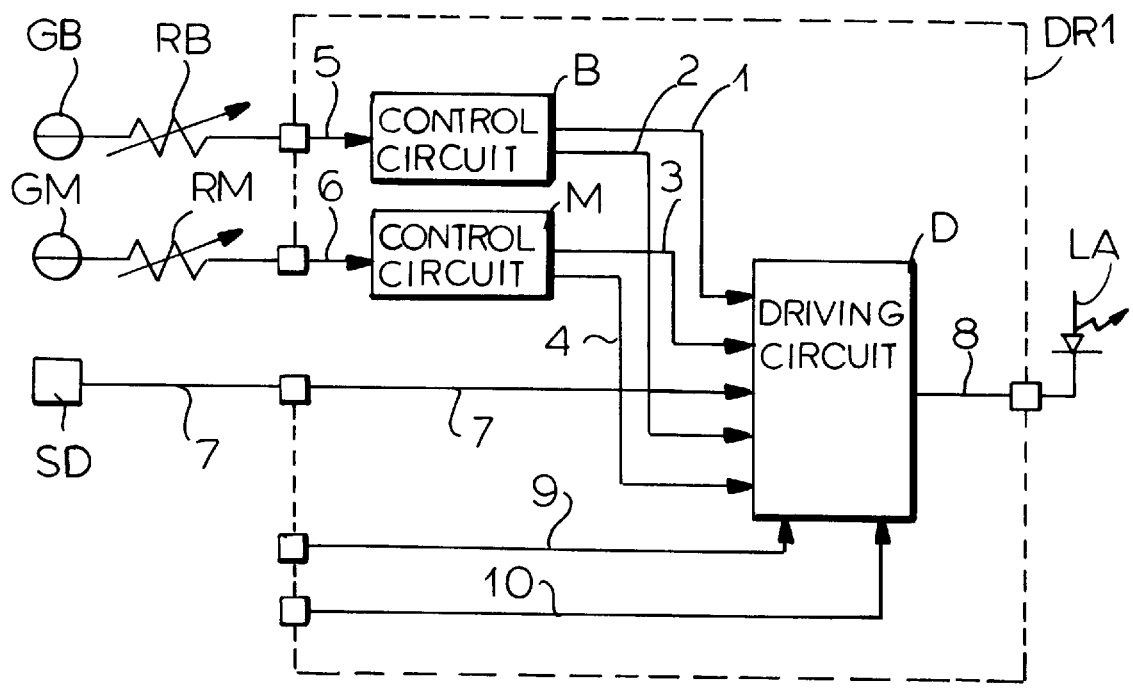
FIG. 1 is a block diagram of a driving circuit for a single laser diode.

In FIG. 1, concerning the driving of a single source LA, the driving device DR1, of the present invention, consists essentially of three parts. The first part, denoted by D, is the actual driving circuit which generates and applies to laser diode LA the bias and modulation currents $I_b$, $I_m$ requested for transmission of a given data bit. The remaining two parts, indicated as B and M, are control circuits for the bias and the modulation current, respectively, and supply circuit D with the bias voltages for the transistors generating these currents. Device DR1 is to drive both n-type and p-type laser diodes. Therefore circuit D, as we see better later, shall comprise current generators manufactured with p-type and n-type transistors, which require different bias voltages. Thus, circuits B and M shall supply two different voltage levels, on outputs 1, 2 or 3, 4 respectively. It is assumed that outputs 1 and 3 carry the voltages required by p-type transistors and outputs 2, 4 carry those required by n-type transistors. The voltage levels supplied by circuits B, M are adjustable from the outside and are obtained from currents supplied by current generators GB, GM, by means of regulation devices represented by variable resistors RB, RM. Generators GB, GM supply as control current a fraction of the bias or modulation currents actually requested by the laser diode (e.g. 10%). Control currents are supplied to B, M through lines 5, 6.

Advantageously, each of the three parts D, B, M composing the device is made as a peripheral cell (pad) of a CMOS integrated circuit, and the cells forming circuits B and M have the same structure. Of course, the control current generators and the adjustment resistors will be located externally of the integrated circuit. This construction allows a high flexibility in the layout and an easy modular expansion of the circuit.

The actual driving circuit D (output cell of the device) receives the data signal to be transmitted from a data source SD through line 7, and emits on output 8 the total current $I_b+I_m$. The cell comprises two sets of identical circuits, driving laser diodes with either conductivity type. According to the conductivity type, output 8 will be connected to the anode or the cathode of the laser diode. In the Figure, we have supposed that the laser diode to be driven is a p-type laser diode. Selection is performed by a signal (in particular, ground voltage or +5V) applied to D through line 9. Another signal allows enabling, through line 10, the output of cell D.

Controlling the device by means of a current, and not by means of a voltage as usual, allows a greater independence from the manufacturing process of the integrated circuit and therefore a greater control precision. In fact, it is to be remembered that in the case of a voltage control, the transistor switching point depends on the doping. As in CMOS technology pairs of transistors doped in complementary way are manufactured, it is impossible to guarantee that the doping level of the two transistors is exactly the same, and therefore the responses of the two transistors can be different.

When driving a laser diode array LA1 . . . LAn, the device, indicated as DR2 in FIG. 2, comprises: a plurality of output cells D1 . . . Dn, the number of which is the same as that of the laser diodes in the array and which are connected each to a respective data source SD1 . . . SDn, and a single pair of control cells B,M obtaining control voltages for all cells D1 . . . Dn from the currents generated by GB, GM. References 7-1 . . . 7n, 8-1 . . . 8n indicate the data transfer lines and the outputs of cells D1 . . . Dn. Since all laser diodes in the array are of the same type, the laser diode type selection signal on line 9 will be common to all output cells D1 . . . Dn. The enabling signal is common too.

In FIG. 3, PD, ND indicate the two parts of cell D intended to drive a p-type or n-type laser diode. As usual, on the cell edge, little black squares indicate the signal inputs from other integrated circuit cells and little white squares external signal inputs. Both parts comprise a set of three final MOS transistors T1, T2, T3 (of p-type) and T4, T5, T6 (of n-type) which form the generators of currents $I_b$ and $I_m$. The control voltages generated by cells B and M (FIG. 1, 2) are applied to the gates of the first two transistors in either set (T1, T2 or T4, T5, respectively) while the data signal is applied to the gate of the third transistor (T3 or T6). Transistors T1 or T4 generate bias current $I_b$ for the laser diode according to the value of the control current supplied by generator GB (FIG. 1), while transistors pairs T2, T3 or T5, T6 generate modulation current $I_m$ according to the value of the control current supplied by generator GM (FIG. 1) and to the logic value of the data bit to be transmitted. The three transistors of each set are connected to each other, to the supply terminals and to cell output 8 in the way described in the aforesaid European Patent Application EP-A 0 687 046.

The voltages supplied by cells B and M (FIGS. 1, 2) are applied to the gates of transistors T1, T2 or T4, T5 through CMOS gates P1, P2 or P4, P5 respectively, followed by π filters F1, F2 or F3, F4, respectively. The data signal is applied instead to transistors T3, T6 through further CMOS gates P3, P6 and amplification means AM1, AM2, made for instance by a cascade of CMOS inverters, as described in the aforesaid European Patent Application. A control logic LC enables in a mutually exclusive way the gate sets P1–P3 or P4–P6 to let the signals at their inputs pass, according to the value of the signal for selection of laser diode type on line 9. Therefore, at the output of cell D there is the current $I_b+I_m$ generated by either ND or LD. The enabling signal on line 10 is also supplied to the same control logic LC and is logically combined with the selection signal. The implementation of a circuit like LC is ordinary design technique.

The operation of each part PD, ND of the output circuit corresponds to that described in the aforesaid European Patent Application.

Figure 4:
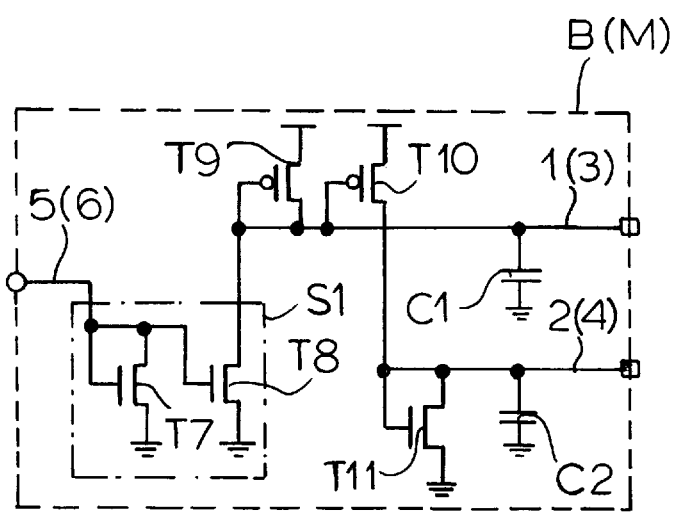
FIG. 4 is a circuit diagram of a control cell.

As can be seen in FIG. 4, cells B, M obtain the control voltages for the final transistors T1, T2, T4, T5 of cell D (FIG. 3) through a series of current mirrors, which allow decoupling the gates of these transistors from the input pin for the control current (and therefore from the respective generator GB, GM, FIG. 1). A first current mirror S1 comprising, for instance, a pair of n-type MOS transistors T7, T8, converts the control current into a voltage signal which is transferred to the gate of final transistor T1 or T2 (FIG. 3) through a second current mirror whose first stage comprises two p-type transistors T9, T10 (whose gates are connected to the drain of the output transistor T8 of S1 and to line 1 or 3), while the output stage consists of the same transistor T1 or T2 to be biased. A third current mirror, whose first stage consists of n-type transistor T11 (whose gate and drain are both connected to the source of transistor T10 and to line 2 or 4) and whose second stage consists of transistor T4 or T5, obtains the control signal for the gate of transistor T4 or T5 from the output signal of the first stage of the second current mirror. The cell also comprises capacitors C1, C2, having filtering functions, between the cell outputs and the ground.

It should also be noted that, supposing that generators GB, GM (FIG. 1) supply only a fraction of the total current required by the laser diode, final transistors T1, T2, T4, T5 (FIG. 3) of cell D shall have to be dimensioned so as to produce the final current required (therefore, their dimension should be about 10 times greater, supposing the control current is the 10% of the final current).

Figure 2:
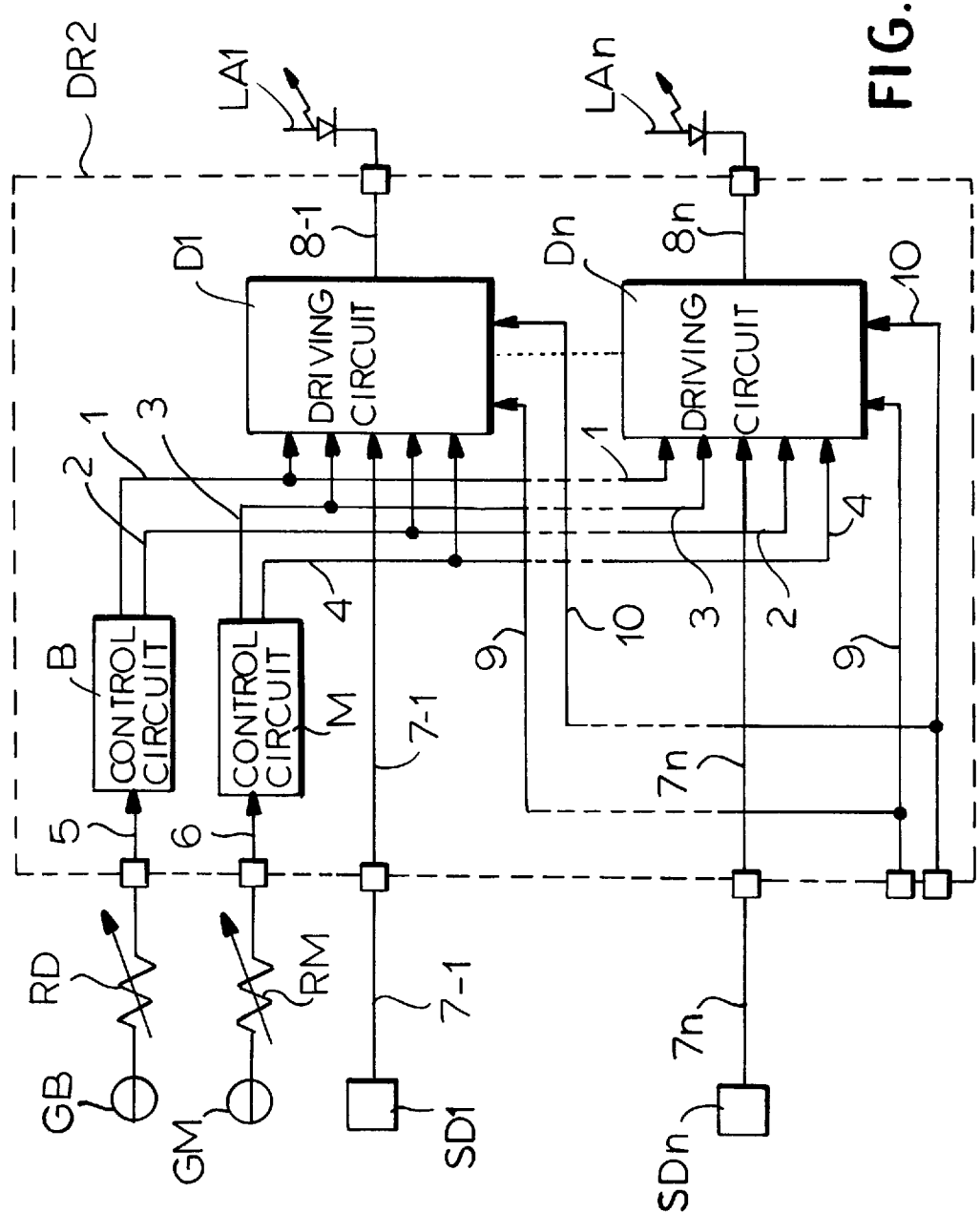
FIG. 2 is a block diagram of a driving circuit for an array of laser diodes.

The presence of capacitors C1, C2 (FIG. 4) in cells B, M and the presence of p filters F1, F2 in the output cells in the configuration of FIG. 2 is necessary in order to avoid cross-talk between the different channels. In this configuration, voltage oscillations across one of laser diodes LA1 ... LAn of the array could propagate toward cells B, M through the parasitic capacitances of final transistors T1 ... T6 (FIG. 3) of the respective output cell D1 ... Dn of the device. As cells B, M are common to all output cells, disturbances so introduced could in turn modulate the current driving the other laser diodes, thereby introducing an undesirable noise. The propagation of these disturbances is actually blocked with the described arrangement. The filters are also provided in the case of the driving circuit for a single laser diode (where in theory they should not be necessary), as this allows having the same cell type in both applications, with clear manufacturing advantages.

It is clear that what has been described above is given purely by way of non-limiting example, and that variations and modifications are possible without going out of the scope of the invention. In particular, even if the description focuses explicitly on laser diodes driving, it may be applied unaltered to LED driving, by choosing modulation and bias current values accordingly.

We claim:

1. Circuit in CMOS technology for high speed driving of optical sources, comprising:

means for generating a bias current for the optical source, comprising a first MOS transistor whose gate is connected to a first output of a first control voltage source, whose source is connected to a first power supply terminal and whose drain is connected to the circuit output; and means for generating a modulation current for the optical source, comprising a second and a third MOS transistors, arranged in series and having the same conductivity as the first transistor, the second transistor having its source connected to said first power supply terminal, the gate connected to a first output of a second control voltage source and the drain connected to the source of the third transistor, whose gate in turn is connected to a digital data signal input and whose drain is connected to the circuit output;

said means for generating the bias current further comprise a fourth MOS transistor, whose conductivity is complementary to that of the first transistor and in which the gate is connected to a second output of the first control voltage source, the source is connected to a second power supply terminal and the drain is connected to the circuit output; and said means for generating the modulation current further comprise a fifth and a sixth MOS transistors, arranged in series and having the same conductivity as the fourth transistor, the fifth transistor having its source connected to said second power supply terminal, its gate connected to a second outout of the second control voltage source, and its drain connected to the source of the sixth transistor, whose gate in turn is connected to said digital data signal input and whose drain is connected to the circuit output;

said first and second control voltage sources each having an input connected to a respective generator of an adjustable control current and present on said first and second outputs two different control voltages for controlling the bias and the modulation currents of the optical sources with complementary conductivity, the control voltages of said first control voltage source being supplied to the first and the fourth transistors, respectively, and the control voltages of said second control voltage being supplied to the second and the fifth transistors respectively;

and the circuit further comprising:

a first and a second set of CMOS gates, arranged between the gates of said first, second and third transistors and respectively of said gates of said fourth, fifth and sixth transistors on one side, and the first outputs of the first and the second control voltage sources, respectively, the second outputs of the first and second control voltage sources, and said digital data signal input on the other end; and means for enabling in a mutually exclusive way, either set of gates according to a selection signal imposed externally and having a first or a second value according to the conductivity of the optical source to be driven.

2. Driving circuit as in claim 1, characterized in that the means for generating the bias current and the means for generating the modulation current belong to a first pad of an integrated circuit, which pad also comprises the first and the second set of CMOS gates, the enabling means for these gates and amplification means for the digital data signal input, and the first and the second control voltage sources are a second and a third pad of said integrated circuit, respectively.

3. Driving circuit as in claim 2, characterized in that for driving an array of optical sources, it comprises an array of said first pads, one for each source in the array, and a second and a third pad (B, M) supplying the control voltages to all the first pads.

4. Driving circuit as in claim 2, characterized in that said second and third pads each comprise a first current mirror receiving the adjustable control current and generating a first voltage signal, and an input stage which comprises a second and a third current mirrors, which comprise transistors having complementary conductivity, are connected in series to each other and to the first mirror, and provide the two control voltages in response to said first voltage signal.

5. Driving circuit as in claim 4 characterized in that it also comprises first and second filtering means connected to the outputs of said second and third pads, respectively, third, fourth, fifth and sixth filter means coupled between said first and second control voltage sources and to lines that, in said first pad convey the control voltages to the gates of said first, second, fourth and fifth transistors, respectively.

\* \* \* \* \*